(12) United States Patent
Wu et al.

(10) Patent No.: US 12,356,822 B2
(45) Date of Patent: Jul. 8, 2025

(54) OLED DISPLAY PANEL HAVING MULTIPLE LIGHT-EMITTING LAYERS AND A PIXEL DEFINITION LAYER PROVIDED WITH OPENINGS, AND PREPARATION METHOD THEREFOR, AND DISPLAY APPARATUS

(71) Applicant: BOE Technology Group Co., Ltd., Beijing (CN)

(72) Inventors: Haidong Wu, Beijing (CN); Xiaobo Du, Beijing (CN); Xiaojin Zhang, Beijing (CN); Guanyin Wen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 514 days.

(21) Appl. No.: 17/771,824

(22) PCT Filed: Jul. 7, 2021

(86) PCT No.: PCT/CN2021/104911
§ 371 (c)(1),
(2) Date: Apr. 26, 2022

(87) PCT Pub. No.: WO2022/042059
PCT Pub. Date: Mar. 3, 2022

(65) Prior Publication Data
US 2022/0376001 A1 Nov. 24, 2022

(30) Foreign Application Priority Data
Aug. 27, 2020 (CN) .......... 202010874949.X

(51) Int. Cl.
*H10K 59/35* (2023.01)
*H10K 50/18* (2023.01)
(Continued)

(52) U.S. Cl.
CPC ............ *H10K 59/35* (2023.02); *H10K 59/12* (2023.02); *H10K 71/00* (2023.02); *H10K 50/181* (2023.02); *H10K 59/1201* (2023.02)

(58) Field of Classification Search
CPC ........ H10K 59/35; H10K 71/00; H10K 59/12; H10K 59/1201; H10K 50/181;
(Continued)

(56) References Cited

U.S. PATENT DOCUMENTS

2006/0186804 A1* 8/2006 Sakakura ......... H10K 59/80515
313/506
2007/0290604 A1* 12/2007 Sakanoue ............... H10K 50/17
313/503
(Continued)

FOREIGN PATENT DOCUMENTS

| CN | 102163615 A | 8/2011 |
|----|-------------|--------|
| CN | 102800812 A | 11/2012 |

(Continued)

OTHER PUBLICATIONS

Office Action dated Jan. 28, 2023 for Chinese Patent Application No. 202010874949.X and English Translation.
(Continued)

Primary Examiner — Duy T Nguyen
(74) Attorney, Agent, or Firm — Ling Wu; Stephen Yang; Ling and Yang Intellectual Property

(57) ABSTRACT

An OLED display panel, a preparation method therefor, and a display apparatus. The display panel includes a display area including a first sub-pixel, a second sub-pixel and a third sub-pixel displaying different colors; the display area includes a first electrode layer, a pixel defining layer, an organic functional layer and a second electrode layer sequentially arranged on a substrate; the organic functional layer includes a first light-emitting layer in the first sub-
(Continued)

pixel, a second light-emitting layer in the second sub-pixel, and a third light-emitting layer covering the display area and having an integrated structure; the orthographic projection, on the substrate, of each of the first light-emitting layer and the second light-emitting layer includes the orthographic projection of an opening on the substrate, which defines a corresponding sub-pixel, of the pixel defining layer and does not overlap with orthographic projections of remaining openings of the pixel defining layer on the substrate.

20 Claims, 4 Drawing Sheets

(51) Int. Cl.
*H10K 59/12* (2023.01)
*H10K 71/00* (2023.01)

(58) Field of Classification Search
CPC . H10K 50/11; H01L 27/1214; H01L 27/1288; H10D 86/0231; H10D 86/60; H10D 86/40
USPC .......................................................... 257/40
See application file for complete search history.

(56) References Cited

U.S. PATENT DOCUMENTS

| | | | | |
|---|---|---|---|---|
| 2010/0327268 A1* | 12/2010 | Kubota | ................ | H10K 50/14 438/46 |
| 2011/0180825 A1 | 7/2011 | Lee et al. | | |
| 2011/0240965 A1 | 10/2011 | Yoon et al. | | |
| 2012/0298968 A1 | 11/2012 | Kim et al. | | |
| 2013/0043498 A1* | 2/2013 | Pyo | ..................... | H10K 50/166 257/89 |
| 2014/0175391 A1* | 6/2014 | Song | .................. | H10K 30/865 438/34 |
| 2014/0217367 A1* | 8/2014 | Song | .................. | H10K 50/14 438/46 |
| 2014/0361257 A1* | 12/2014 | Park | .................... | H10K 59/805 257/40 |
| 2015/0155515 A1 | 6/2015 | Kim et al. | | |
| 2015/0255741 A1 | 9/2015 | Lee et al. | | |
| 2016/0163772 A1 | 6/2016 | Wu | | |
| 2017/0162638 A1* | 6/2017 | Nendai | ................ | H10K 71/13 |
| 2017/0271413 A1 | 9/2017 | Liao et al. | | |

FOREIGN PATENT DOCUMENTS

| | | |
|---|---|---|
| CN | 103779387 A | 5/2014 |
| CN | 103887320 A | 6/2014 |
| CN | 107180847 A | 9/2017 |
| CN | 103887320 B | 10/2018 |
| CN | 104681580 B | 5/2019 |
| CN | 111162108 A | 5/2020 |
| CN | 111785744 A | 10/2020 |
| KR | 10-2015-0043889 A | 4/2015 |

OTHER PUBLICATIONS

International Search Report for PCT/CN2021/104911 Mailed Sep. 28, 2021.

* cited by examiner

OLED DISPLAY PANEL HAVING MULTIPLE LIGHT-EMITTING LAYERS AND A PIXEL DEFINITION LAYER PROVIDED WITH OPENINGS, AND PREPARATION METHOD THEREFOR, AND DISPLAY APPARATUS

CROSS-REFERENCE TO RELATED APPLICATIONS

The present application is a U.S. National Phase Entry of International Application PCT/CN2021/104911 having an international filing date of Jul. 7, 2021, which claims priority of Chinese Patent Application No. 202010874949.X, filed to the CNIPA on Aug. 27, 2020 and entitled "OLED Display Panel, and Preparation Method Therefor, and Display Apparatus", the contents disclosed in the above-mentioned applications are hereby incorporated as a part of this application.

TECHNICAL FIELD

Embodiments of the present disclosure relate to, but are not limited to, the field of display technology, and in particular to an OLED display panel and a method for preparing the OLED display panel, and a display apparatus.

BACKGROUND

Some organic light emitting diode (OLED) display panels mainly adopt a scheme of red, green and blue sub-pixels, and a scheme of white OLED with color filter. Different from the scheme of white OLED with color filter, in the scheme of red, green and blue sub-pixels, red, green and blue sub-pixels are mainly prepared separately by a vacuum evaporation process, and fine metal mask (FMM) is required to be used during the evaporation. Since the fine metal mask presents great difficulty in manufacturing, especially the higher resolution of display products will further increase the difficulty in manufacturing, the price of the fine metal mask is very expensive. In addition, defects of fine metal masks will lead to color mixing and other defects in organic electroluminescent display devices, and more fine metal masks used during the preparation will lead to more product defects (such as defects of color mixing), thus reducing the product yield and increasing the manufacturing costs.

SUMMARY

The following is a summary of subject matters described in the present disclosure in detail. The summary is not intended to limit the scope of protection of claims.

An embodiment of the present disclosure provides an OLED display panel, wherein the display panel includes a display region, and the display region includes a first sub-pixel, a second sub-pixel and a third sub-pixel displaying different colors respectively; the display region includes a driving structure layer, a first electrode layer, a pixel definition layer, an organic function layer and a second electrode layer sequentially disposed on the base substrate, wherein the first electrode layer includes multiple first electrodes, and the first electrodes are connected with a pixel drive circuit in the driving structure layer, the pixel definition layer is provided with a first opening, a second opening and a third opening for defining the first sub-pixel, the second sub-pixel and the third sub-pixel respectively, and each opening exposes a surface of a first electrode of a sub-pixel defined by the opening facing away from the base substrate; the organic function layer includes a first light-emitting layer located in the first sub-pixel, a second light-emitting layer located in the second sub-pixel, and a third light-emitting layer covering the display region and having an integrated structure; an orthographic projection of the first light-emitting layer on the base substrate contains an orthographic projection of the first opening on the base substrate and does not overlap with an orthographic projection of the second opening and the third opening on the base substrate; an orthographic projection of the second light-emitting layer on the base substrate contains an orthographic projection of the second opening on the base substrate and does not overlap with an orthographic projection of the first opening and the third opening on the base substrate; the third light-emitting layer is disposed on surfaces of the first light-emitting layer and the second light-emitting layer facing away from the base substrate.

An embodiment of the present disclosure further provides a display apparatus, which includes the OLED display panel.

An embodiment of the present disclosure further provides a method for preparing an OLED display panel, wherein the display panel includes a display region, and the display region includes a first sub-pixel, a second sub-pixel and a third sub-pixel displaying different colors respectively, the method includes:

forming a driving structure layer on a base substrate, wherein the driving structure layer comprises a pixel drive circuit;

forming a first electrode layer on a side of the driving structure layer facing away from the base substrate, wherein the first electrode layer includes multiple first electrodes connected with the pixel drive circuit;

forming a pixel definition layer on a side of the first electrode layer facing away from the base substrate, wherein the pixel definition layer is provided with a first opening, a second opening and a third opening for defining the first sub-pixel, the second sub-pixel and the third sub-pixel respectively, and each opening exposes a surface of a first electrode of a sub-pixel defined by the opening facing away from the base substrate;

forming an organic function layer on the side of the first electrode layer facing away from the base substrate, and forming a second electrode layer on the organic function layer, wherein forming the organic function layer on the side of the first electrode layer facing away from the base substrate includes:

forming a first light-emitting layer in the first sub-pixel, and forming a second light-emitting layer in the second sub-pixel, wherein an orthographic projection of the first light-emitting layer on the base substrate contains an orthographic projection of the first opening on the base substrate and does not overlap with an orthographic projection of the second opening and the third opening on the base substrate, an orthographic projection of the second light-emitting layer on the base substrate contains an orthographic projection of the second opening on the base substrate and does not overlap with an orthographic projection of the first opening and the third opening on the base substrate; and forming a third light-emitting layer on surfaces of the first light-emitting layer and the second light-emitting layer facing away from the base substrate, wherein the third light-emitting layer covers the display region and has an integrated structure.

Other aspects may be understood upon reading and understanding of the drawings and the detailed description.

BRIEF DESCRIPTION OF DRAWINGS

Accompanying drawings are used for providing an understanding of embodiments of the present disclosure, form a part of the specification, and are used to explain the technical solutions of the embodiments of the present disclosure together with the embodiments of the present disclosure, but are not intended to form limitations on the technical solutions of the embodiments of the present disclosure.

DETAILED DESCRIPTION

Those of ordinary skills in the art should understand that modifications or equivalent replacements may be made to the technical solutions of the present disclosure without departing from the spirit and scope of the technical solutions of the present disclosure, and should fall within the scope of the claims of the present disclosure.

Figure 1:
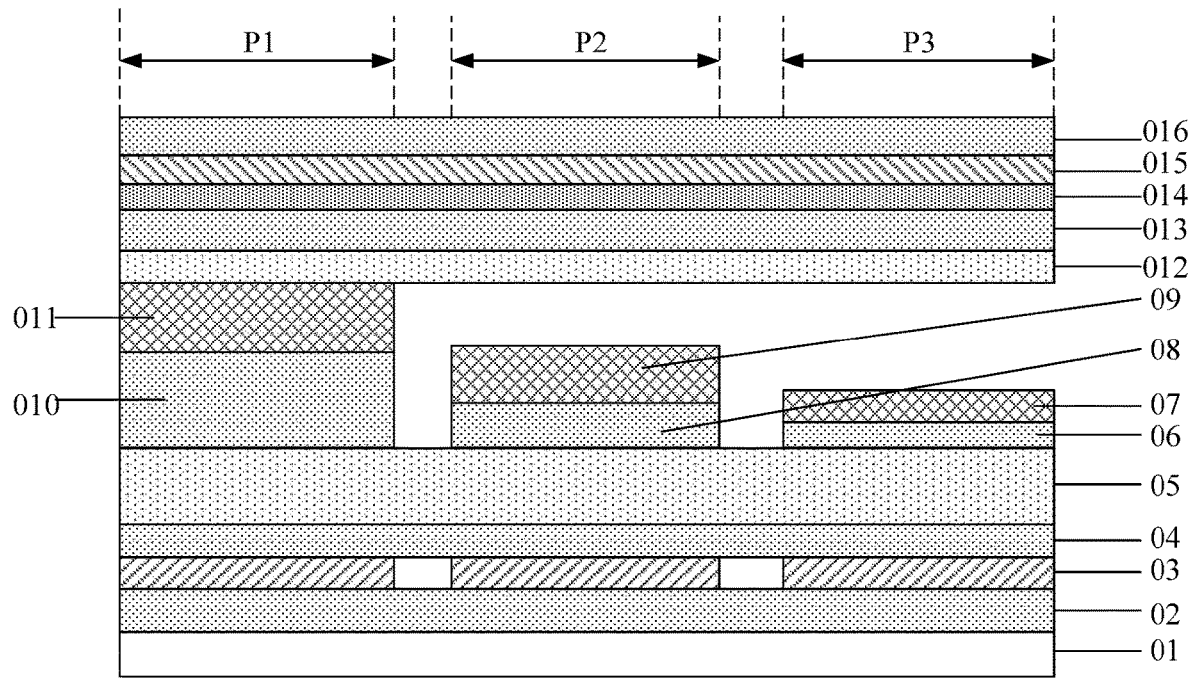
FIG. 1 is a schematic diagram of a structure of a display panel in some technologies.

FIG. 1 shows a schematic diagram of a structure of some OLED display panels using a scheme of red, green and blue sub-pixels. As shown in FIG. 1, multiple pixel units are arranged in an array in a display region of the OLED display panel, and each pixel unit includes a first sub-pixel P1 (such as a red sub-pixel), a second sub-pixel P2 (such as a green sub-pixel), and a third sub-pixel P3 (such as a blue sub-pixel). Each pixel unit includes a first electrode layer 03, a hole injection layer 04, a hole transport layer 05, and a first block layer 010 and a first light-emitting layer 011 disposed on the hole transport layer 05 and located in the first sub-pixel P1, a second block layer 08 and a second light-emitting layer 09 located in the second sub-pixel P2, a third block layer 06 and a third light-emitting layer 07 located in the third sub-pixel P3, and a hole block layer 012 covering the first light-emitting layer 011, the second light-emitting layer 09 and the third light-emitting layer 07, an electron transport layer 013, an electron injection layer 014, a second electrode layer 015, and an encapsulation structure layer 016 which are all stacked on a base substrate 01. The first electrode layer 03 in each pixel unit includes three first electrodes respectively located in three sub-pixels, wherein each first electrode is connected with a corresponding pixel drive circuit in a driving structure layer 02 below the first electrode layer 03 to drive a corresponding sub-pixel to emit light. As shown in FIG. 1, for a film layer exclusive to each sub-pixel, for example, the first block layer 010 and the first light-emitting layer 011 located in the first sub-pixel P1, the second block layer 08 and the second light-emitting layer 09 located in the second sub-pixel P2, along with the third block layer 06 and the third light-emitting layer 07 located in the third sub-pixel P3, an FMM is required to be used in a preparation process by an evaporation process, so that at least six FMMs are required throughout the preparation process of the display panel, and the number of the FMMs used is large, which increases manufacturing costs of the display panel and reduces a product yield.

Figure 2:
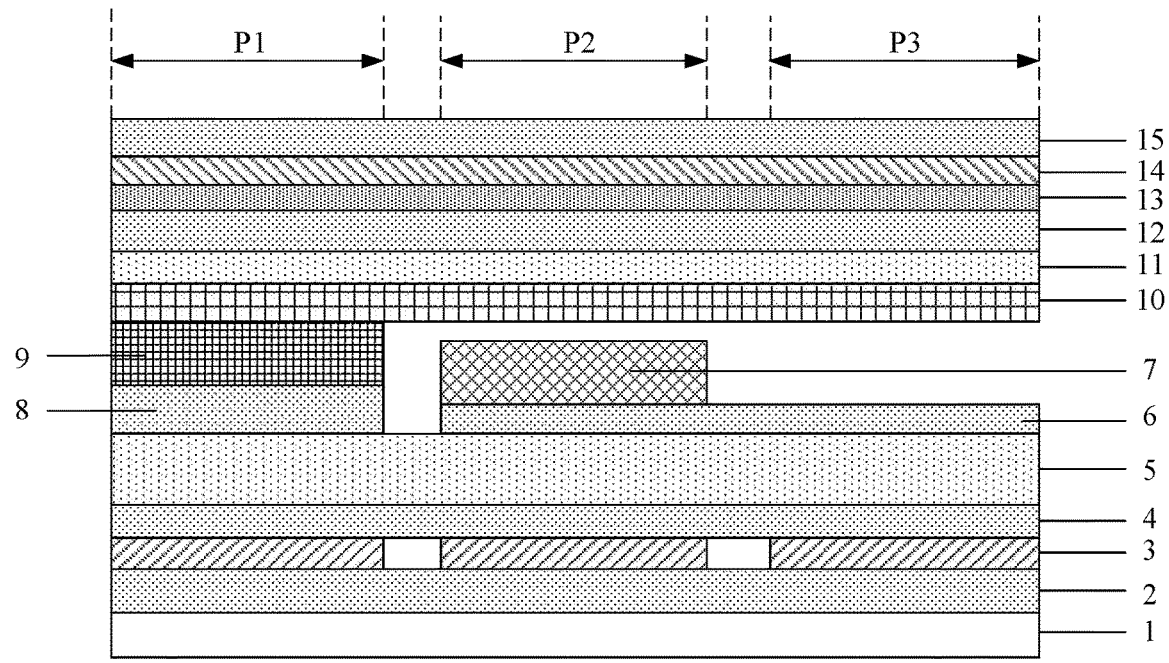
FIG. 2 is a schematic diagram of a structure of an OLED display panel according to an embodiment of the present disclosure.
Figure 3:
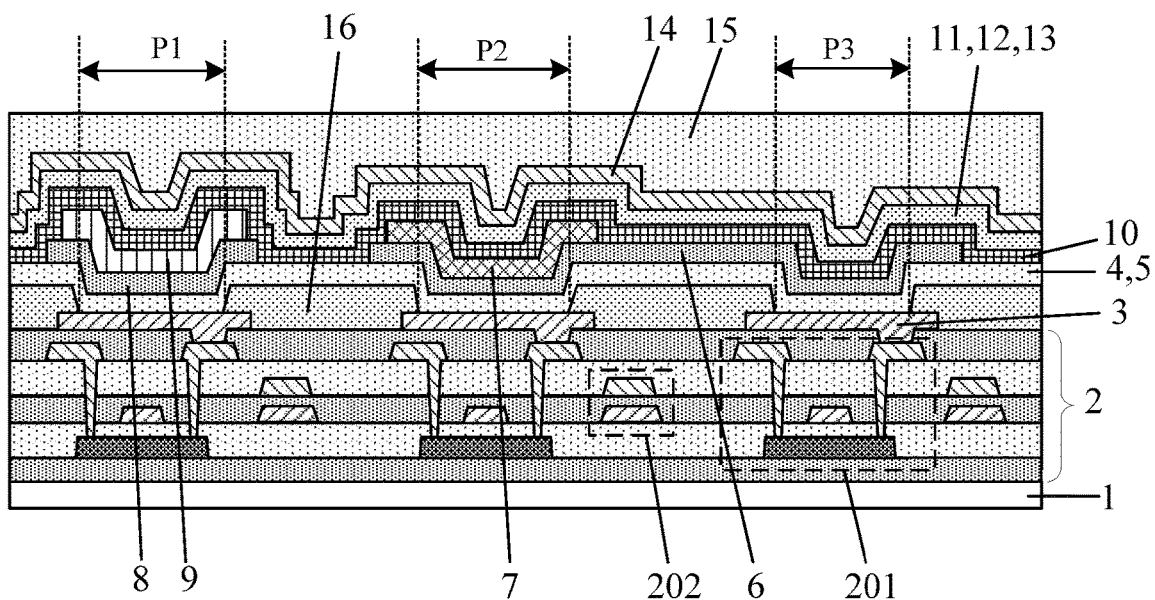
FIG. 3 is a schematic diagram of a cross-sectional structure of the OLED display panel shown in FIG. 2 according to some exemplary embodiments.

An embodiment of the present disclosure provides an OLED display panel, as shown in FIG. 2 and FIG. 3. FIG. 2 is a simplified schematic diagram of a structure of a display panel. The display panel includes a display region including a first sub-pixel P1, a second sub-pixel P2 and a third sub-pixel P3 displaying different colors respectively.

The display region includes a driving structure layer 2, a first electrode layer 3, a pixel definition layer 16 (shown in FIG. 3), an organic function layer and a second electrode layer 14 sequentially disposed on a base substrate 1. The first electrode layer 3 is disposed on the driving structure layer 2, and the first electrode layer 3 includes multiple first electrodes. The first electrodes are connected with a pixel drive circuit in the driving structure layer 2. The pixel definition layer 16 is disposed on the first electrode layer 3 and is provided with a first opening, a second opening and a third opening for defining the first sub-pixel P1, the second sub-pixel P2 and the third sub-pixel P3 respectively, wherein each opening exposes a surface of a first electrode of a sub-pixel defined by the opening facing away from the base substrate 1. The organic function layer is disposed on the first electrode layer 3, and the second electrode layer 14 is disposed on the organic function layer.

The organic function layer includes a first light-emitting layer 9 located in the first sub-pixel P1, a second light-emitting layer 7 located in the second sub-pixel P2, and a third light-emitting layer 10 covering the display region and having an integrated structure (i.e., the third light-emitting layer 10 is a mono-piece covering the display region).

An orthographic projection of the first light-emitting layer 9 on the base substrate 1 contains an orthographic projection of the first opening on the base substrate 1 and does not overlap with an orthographic projection of the second opening and the third opening on the base substrate 1. An orthographic projection of the second light-emitting layer 7 on the base substrate 1 contains the orthographic projection of the second opening on the base substrate 1 and does not overlap with an orthographic projection of the first opening and the third opening on the base substrate 1.

The third light-emitting layer 10 is disposed on surfaces of the first light-emitting layer 9 and the second light-emitting layer 7 facing away from the base substrate 1.

In the OLED display panel of the embodiment of the present disclosure, the first light-emitting layer 9 and the second light-emitting layer 7 are disposed in the first sub-pixel P1 and the second sub-pixel P2 respectively, the third light-emitting layer 10 is disposed on the surfaces of the first light-emitting layer 9 and the second light-emitting layer 7 facing away from the base substrate, and the third light-emitting layer 10 covers the display region of the display panel and has an integrated structure. Therefore, during the preparation of the third light-emitting layer 10 by an evaporation process, an open mask may be used without using a fine metal mask (FMM). Compared with display panels of some technologies, the OLED display panel of the embodiment of the present disclosure can save at least one process using FMM, thus reducing the use times and quantity of the FMM, reducing production costs and improving the product yield.

Herein, the first sub-pixel P1 region includes an orthographic projection region of the first opening of the pixel definition layer 16 on the base substrate 1, the second sub-pixel P2 region includes an orthographic projection region of the second opening of the pixel definition layer 16 on the base substrate 1, and the third sub-pixel P3 region includes an orthographic projection region of the third opening of the pixel definition layer 16 on the base substrate 1. Each sub-pixel includes all film layers from the first electrode to the second electrode layer 14 in a direction perpendicular to the base substrate 1.

In some exemplary embodiments, as shown in FIG. 2 and FIG. 3, the first electrode layer 3 includes multiple first electrodes, wherein the first electrodes may be anodes, and the second electrode layer 14 may be a cathode. The driving structure layer 2 may include multiple pixel drive circuits, wherein each of the pixel drive circuits corresponds to one sub-pixel for display. Each pixel drive circuit may include multiple thin film transistors, wherein a drain electrode of one of the thin film transistors is connected with a first electrode of a corresponding one of the sub-pixels.

For example, the first electrode layer 3 may be a reflective layer and the second electrode layer 14 may be a semi-reflective layer. The first electrode layer 3 may include a metal layer with high reflectivity (such as a silver metal layer) and a transparent oxide layer. A material of the transparent oxide layer may include at least one of indium tin oxide (ITO), indium zinc oxide (IZO). A material of the second electrode layer 14 may include any one or more of the following: magnesium (Mg), silver (Ag), aluminum (Al), and a magnesium-silver alloy.

In some exemplary embodiments, as shown in FIG. 2 and FIG. 3, the first light-emitting layer 9, the second light-emitting layer 7 and the third light-emitting layer 10 may be configured to emit red, green and blue light, respectively.

In this example, the first light-emitting layer 9 is a red light-emitting layer, the second light-emitting layer 7 is a green light-emitting layer, and the third light-emitting layer 10 is a blue light-emitting layer, that is, the blue light-emitting layer is a common film layer for all sub-pixels, and the blue light-emitting layer is located on a side of the red light-emitting layer and the green light-emitting layer facing the second electrode layer 14. Since a band gap of blue luminescent materials is larger than those of red luminescent materials and green luminescent materials. Therefore, in the first sub-pixel P1, holes and electrons from the first electrode layer 3 and the second electrode layer 14 respectively, are more likely to be combined in the red light-emitting layer with a smaller band gap to emit red light, while the blue light-emitting layer does not emit light. In the second sub-pixel P2, holes and electrons from the first electrode layer 3 and the second electrode layer 14 respectively, are more likely to emit green light in the green light-emitting layer with a smaller band gap, while the blue light-emitting layer does not emit light. In addition, since wavelengths of red light, green light and blue light decrease sequentially, their excitation energy required increases sequentially, therefore, when the red light and green light emitted by the red light-emitting layer and the green light-emitting layer respectively, irradiate the blue light-emitting layer, the blue light-emitting layer will not be photo-excited to emit blue light, so that the first sub-pixel P1 can normally display red and the second sub-pixel P2 can normally display green. In the third sub-pixel P3, holes and electrons from the first electrode layer 3 and the second electrode layer 14 respectively, are combined in the blue light-emitting layer to emit blue light, and the third sub-pixel P3 displays blue light. In this example, the total number of film layers of the organic function layer in the first sub-pixel P1, the second sub-pixel P2, and the third sub-pixel P3 may be gradually reduced.

In some exemplary embodiments, as shown in FIG. 2 and FIG. 3, the organic function layer further includes an electron block layer 6 located at least in the third sub-pixel P3 and the second sub-pixel P2, an orthographic projection of the electron block layer 6 on the base substrate 1 contains an orthographic projection of the third opening and the second opening on the base substrate 1, and the second light-emitting layer 7 and the third light-emitting layer 10 in the third sub-pixel P3 are both disposed on a surface of the electron block layer 6 facing away from the base substrate 1. The electron block layer 6 can block migration of electrons in the second light-emitting layer 7 and the third light-emitting layer 10 towards the first electrode layer (anode) 3, and can improve a light-emitting efficiency of the second light-emitting layer 7 and the third light-emitting layer 10. By way of example, a material of the electron block layer 6 may be a material whose hole mobility is higher than the electron mobility, for example, a carbazole material. The highest occupied molecular orbit (HOMO) energy level of the host material of the electron block layer 6 may be higher than 5.3 eV (electron volt), and a triplet energy level (T1) may be higher than 2.5 eV.

In some exemplary embodiments, as shown in FIG. 2 and FIG. 3, the orthographic projection of the electron block layer 6 on the base substrate 1 does not overlap with the orthographic projection of the first opening on the base substrate 1.

In some exemplary embodiments, as shown in FIG. 2 and FIG. 3, the organic function layer may further include a buffer layer 8 located in the first sub-pixel P1, an orthographic projection of the buffer layer 8 on the base substrate 1 contains the orthographic projection of the first opening on the base substrate 1 and does not overlap with an orthographic projection of the second opening and the third opening on the base substrate 1, and the first light-emitting layer 9 is disposed on a surface of the buffer layer 8 facing away from the base substrate 1. The buffer layer 8 may function in blocking electrons or excitons, and a material of the buffer layer 8 may be a material whose hole mobility is higher than the electron mobility, for example, a carbazole material. The highest occupied molecular orbit (HOMO) energy level of the host material of the buffer layer 8 may be higher than 5.3 eV, and a triplet energy level (T1) may be higher than 2.5 eV.

In some exemplary embodiments, as shown in FIG. 2 and FIG. 3, the organic function layer may further include any one or more of the following film layers disposed on a side of the electron block layer 6 and the buffer layer 8 facing the first electrode layer 3: a hole injection layer 4, a hole transport layer 5. The hole injection layer 4 and the hole transport layer 5 are both film layers covering the display region and having an integrated structure, i.e. any one film layer covers the display region and is mono-piece.

In an example of this embodiment, the hole injection layer 4 and the hole transport layer 5 are sequentially stacked on the first electrode layer 3, and both the electron block layer 6 and the buffer layer 8 are disposed on a surface of the hole transport layer 5 facing away from the base substrate 1. The hole injection layer 4 may function in reducing hole injection barrier and improving a hole injection efficiency. The hole transport layer 5 may function in improving hole transport rate, and may also reduce the hole injection barrier and improve the hole injection efficiency.

In some exemplary embodiments, as shown in FIG. 2 and FIG. 3, the organic function layer may further include any one or more of the following film layers disposed between the third light-emitting layer 10 and the second electrode layer 14: a hole block layer 11, an electron transport layer 12, and an electron injection layer 13, wherein each of the hole block layer 11, the electron transport layer 12, and the electron injection layer 13 is a film layer covering the display region and having an integrated structure.

In an example of this embodiment, the hole block layer 11, the electron transport layer 12, and the electron injection layer 13 are sequentially stacked on a surface of the third light-emitting layer 10 facing away from the base substrate 1, and the second electrode layer 14 is disposed on a surface of the electron injection layer 13 facing away from the first electrode layer 3. The hole block layer 11 can block migration of holes to the side where the second electrode layer 14 is located. The electron transport layer 12 may increase the electron transport rate. The electron injection layer 13 may reduce electron injection barrier and improve electron injection efficiency.

In some exemplary embodiments, as shown in FIG. 2 and FIG. 3, each film layer of the organic function layer in the third sub-pixel P3 covers the display region and has an integrated structure.

Figure 4:
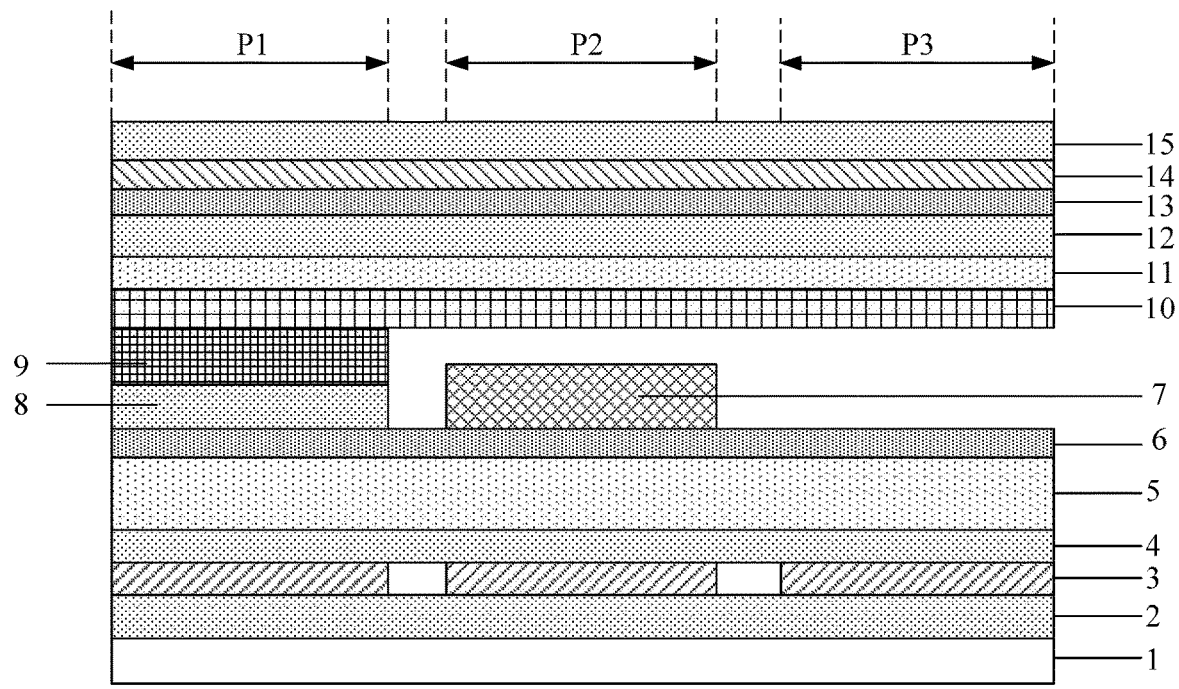
FIG. 4 is a schematic diagram of a structure of another OLED display panel according to an embodiment of the present disclosure.
Figure 5:
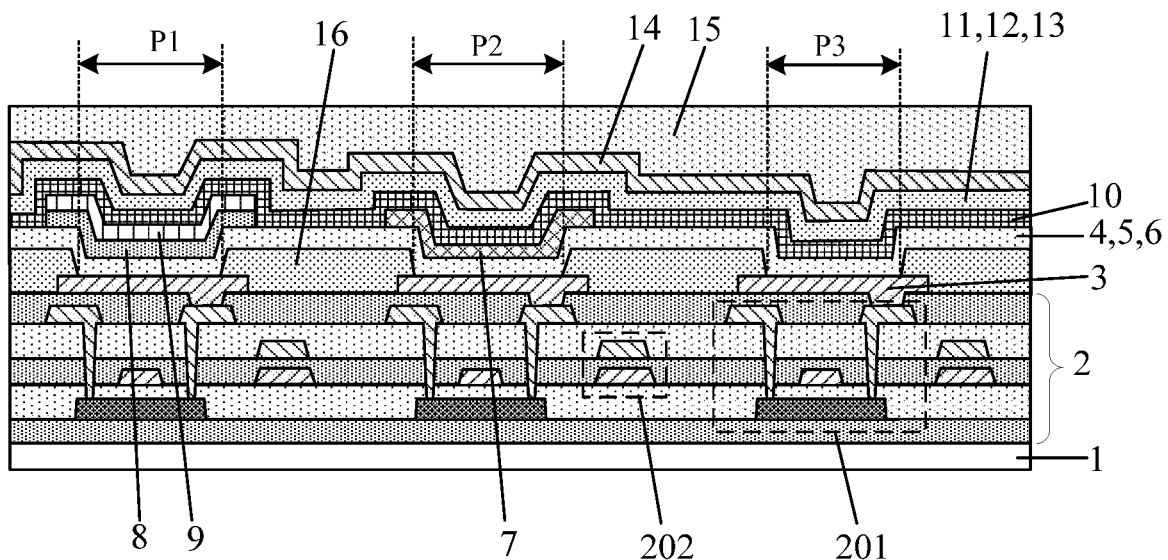
FIG. 5 is a schematic diagram of a cross-sectional structure of the OLED display panel shown in FIG. 4 according to some exemplary embodiments.

In some exemplary embodiments, as shown in FIG. 4 and FIG. 5, the electron block layer 6 covers the display region and has an integrated structure, the orthographic projection of the electron block layer 6 on the base substrate 1 contains the orthographic projection of the third opening, the second opening and the first opening on the base substrate 1, and the buffer layer 8 is disposed on a surface of the electron block layer 6 in the first sub-pixel P1 facing away from the base substrate 1.

In some exemplary embodiments, as shown in FIG. 4 and FIG. 5, the organic function layer may further include any one or more of the following film layers disposed between the first electrode layer 3 and the electron block layer 6: a hole injection layer 4, a hole transport layer 5, wherein each of the hole injection layer 4 and the hole transport layer 5 is a film layer covering the display region and having an integrated structure.

In an example of this embodiment, the hole injection layer 4 and the hole transport layer 5 are sequentially stacked on the first electrode, and the electron block layer 6 is disposed on the surface of the hole transport layer 5 facing away from the base substrate 1.

In some exemplary embodiments, the display panel may be a top emission OLED display panel. The display panel may further include a reflective layer disposed between the driving structure layer 2 and the first electrode layer 3, and a light extraction layer disposed between the second electrode layer 14 and an encapsulation structure layer 15. Thus, a light extraction efficiency of the display panel can be improved.

In some exemplary embodiments, materials of the electron block layer 6 and the buffer layer 8 may each be a material with a hole mobility much higher than the electron mobility, materials of the first light-emitting layer 9, the second light-emitting layer 7 and the third light-emitting layer 10 may each be a material with electron mobility higher than hole mobility, therefore, when electrons injected from the second electrode layer (cathode) 14 and holes injected from the first electrode layer (anode) 3 in each sub-pixel reach an interface between the light-emitting layer of the sub-pixel and the electron block layer 6 or the buffer layer 8, they are combined at a side of the interface close to the light-emitting layer to achieve light emission. In the first sub-pixel P1 and the second sub-pixel P2, the third light-emitting layer 10 does not emit light and functions in transporting electrons.

In some exemplary embodiments, in order to obtain a top emission OLED display panel with high light extraction efficiency and high color purity, optical microcavity structure characteristics need to be considered when designing the film layer structure of the OLED display panel. Each sub-pixel can form a microcavity structure between the first electrode layer 3 and the second electrode layer 14. By adjusting a total film layer thickness of the organic function layer of each sub-pixel, the microcavity structure formed by each sub-pixel can meet conditions for microcavity interference, thereby obtaining the optimal optical and electrical characteristics required by each sub-pixel. By way of example, as shown in FIG. 2, for the first sub-pixel (which may be a red sub-pixel) P1, the buffer layer 8 and the first light-emitting layer 9 are film layers exclusive to the first sub-pixel P1, and a microcavity length of the microcavity structure of the first sub-pixel P1 may be adjusted by adjusting a thickness of the buffer layer 8 and the first light-emitting layer 9, thereby obtaining the optimal optical and electrical characteristics required by the first sub-pixel P1. Herein, presence of the buffer layer 8 can reduce a thickness of the first light-emitting layer 9, and can avoid increasing driving voltage of the first sub-pixel P1 due to the excessively thick first light-emitting layer 9. By adjusting the thicknesses of the electron block layer 6 and the second light-emitting layer 7, the microcavity length of the second sub-pixel (which may be a green sub-pixel) P2 can be adjusted, thereby obtaining optimum optical and electrical characteristics required by the second sub-pixel P2. For the third sub-pixel P3, it is necessary to comprehensively consider the thickness of each film layer of the organic function layer of the third sub-pixel (which may be a blue sub-pixel) P3, so as to obtain optimal optical and electrical characteristics of the third sub-pixel P3. By effectively utilizing the microcavity effect, the required optimal optical and electrical characteristics can be obtained, and the thickness of organic function layer, material consumption and process time can be reduced.

A method for preparing the display panel of the embodiment of the present disclosure will be described below with reference to the structure of the display panel shown in FIG. 3 and FIG. 5. In order to describe masking times of the display panel in detail, "patterning process" is hereinafter used to denote each process of forming a pattern, and each patterning process corresponds to one mask process. For an inorganic material (e.g., a metal layer and an inorganic layer), a "patterning process" may include procedures such as coating with a photo-resist, masking exposure, development, etching, stripping of the photo-resist and the like. For an organic material (e.g., a photo-resist and an organic resin), a "patterning process" may include procedures such as masking exposure, development treatment and the like. The deposition may be any one or more of sputtering, evaporation and chemical vapor deposition. The coating may be any one or more of spray coating and spin coating. The etching may be any one or more of dry etching and wet etching. A "thin film" refers to a layer of thin film prepared from a certain material on a base substrate by a depositing or coating process. If no patterning process is needed by the "thin film" in the whole making process, the "thin film" may also be called a "layer". If the patterning process is needed by the "thin film" in the whole making process, the thin film is called a "thin film" before the patterning process and called a "layer" after the patterning process. A "layer" obtained after a patterning process includes at least one "pattern". "A and B are arranged in a same layer" in the present disclosure refers to that A and B are simultaneously formed by the same patterning process. A "thickness" of a film layer is a dimension of the film layer in a direction perpendicular to the substrate.

Figure 6:
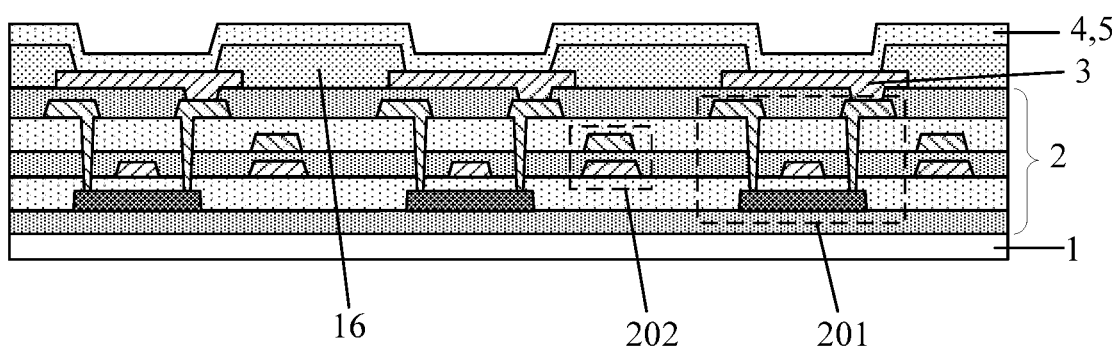
FIG. 6 is a schematic diagram of a structure after a driving structure layer, a first electrode layer, a hole injection layer, and a hole transport layer are formed on a base substrate during preparation of the OLED display panel shown in FIG. 3 according to some exemplary embodiments.

(1) forming a driving structure layer 2 on a base substrate 1, wherein the driving structure layer 2 includes a pixel drive circuit. By way of example, as shown in FIG. 6, a preparation process of the driving structure layer 2 may include the following:

Depositing a first insulating thin film and an active layer thin film sequentially on a base substrate 1, and patterning the active layer thin film by a patterning process to form a first insulating layer covering the base substrate 1 and a pattern of the active layer disposed on the first insulating layer, wherein the pattern of the active layer includes at least an active layer of each sub-pixel.

Then, depositing a second insulating thin film and a first metal thin film sequentially, and pattering the first metal thin film by a patterning process to form a second insulating layer covering the pattern of the active layer and to form a pattern of a first gate metal layer disposed on the second insulating layer, wherein the pattern of the first gate metal layer includes at least a gate electrode and a first capacitor electrode of each sub-pixel.

Then, depositing a third insulating thin film and a second metal thin film sequentially, and patterning the second metal thin film by a patterning process to form a third insulating layer covering the first gate metal layer and a pattern of a second gate metal layer disposed on the third insulating layer. The pattern of the second gate metal layer includes at least a second capacitor electrode of each sub-pixel, and a position of the second capacitor electrode corresponds to that of the first capacitor electrode. The first capacitor electrode and the second capacitor electrode constitute a storage capacitor 202.

Then, depositing a fourth insulating thin film, and patterning the fourth insulating thin film by a patterning process to form a pattern of a fourth insulating layer covering the second gate metal layer, wherein the fourth insulating layer of each sub-pixel is provided with at least two vias, the fourth insulating layer, the third insulating layer and the second insulating layer in the two vias are etched away, to expose a surface of the active layer of each sub-pixel.

Then, depositing a third metal thin film, and patterning the third metal thin film by a patterning process to form a pattern of a source and drain metal layer on the fourth insulating layer. The source and drain metal layer includes at least a source electrode and a drain electrode of each sub-pixel, and the source electrode and the drain electrode are respectively connected with the active layer through the two vias penetrating the fourth insulating layer, the third insulating layer and the second insulating layer.

Then, coating a planarization thin film of an organic material on the base substrate 1 with the above patterns formed, and forming a via on the planarization thin film of each sub-pixel through processes such as masking, exposing and developing, and the planarization thin film in the first via is developed to expose a surface of a drain electrode, thereby forming a planarization layer (PLN) covering the base substrate 1.

So far, preparation of the driving structure layer 2 on the flexible base substrate 1 is completed, as shown in FIG. 6. In the driving structure layer 2, the active layer, the gate electrode, the source electrode, and the drain electrode constitute a driving transistor 201 of a pixel drive circuit, and the first capacitor electrode and the second capacitor electrode constitute a storage capacitor 202 of the pixel drive circuit. An active matrix OLED (AMOLED) driving mode can be used for driving an OLED device of each sub-pixel (the OLED device includes a first electrode, an organic function layer and a second electrode layer disposed in a stacked manner) by the pixel drive circuit. The pixel drive circuit may be a 2T1C pixel circuit, that is, two Thin-film transistors (TFTs) and one storage capacitor Cs are used for driving an OLED to emit light.

In this example, the first insulating layer, the second insulating layer, the third insulating layer and the fourth insulating layer may be made of any one or more of silicon oxide (SiOx), silicon nitride (SiNx) and silicon oxynitride (SiON), and may be in a single layer, multiple layers, or in a composite layer. The first insulating layer is called a buffer layer, which is used for improving the water oxygen resistance capability of the base substrate 1. The second insulating layer and the third insulating layer are called gate insulating (GI) layers. The fourth insulating layer is called an interlayer dielectric (ILD) layer. The first metal thin film, the second metal thin film and the third metal thin film may be made of a metal material, such as any one or more of silver (Ag), copper (Cu), aluminum (Al), titanium (Ti) and molybdenum (Mo), or an alloy material of the above metals, such as aluminum-neodymium alloy (AlNd) or molybdenum-niobium alloy (MoNb), which may have a single-layer structure or multi-layer composite structure, such as Ti/Al/Ti. The active layer thin film may be made of an amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene and other materials, that is, the present disclosure is applicable to transistors manufactured based on oxide technology, silicon technology and organic technology.

(2) forming a first electrode layer 3 on the driving structure layer 2, as shown in FIG. 6, by way of example, depositing a first electrode thin film on base substrate 1 with above patterns formed, and patterning the first electrode thin film by a patterning process to form a first electrode layer 3 including multiple first electrodes, wherein the first electrodes are formed on the planarization layer of the driving structure layer 2 and connected with a drain electrode of the driving transistor 202 through a via hole on the planarization layer. The first electrodes may be anodes.

(3) forming a pixel definition layer 16 on the first electrode layer 3, as shown in FIG. 6, coating a pixel definition thin film on the base substrate 1 with the above patterns formed, and forming a pixel definition layer (PDL) 16 with a first opening, a second opening, and a third opening by processes such as masking, exposing, developing, and the like, wherein the pixel definition layer thin film in the first opening, the second opening, and the third opening are developed to expose a surface of a first electrode of a corresponding sub-pixel facing away from the base substrate 1. The first opening, the second opening and the third opening are used for defining the first sub-pixel P1, the second sub-pixel P2 and the third sub-pixel P3 respectively. A material of the pixel definition layer 16 may be polyimide, acrylic, polyethylene terephthalate, or the like.

(4) forming a hole injection layer 4 and a hole transport layer 5 sequentially on the first electrode layer 3. As shown in FIG. 6, first forming the hole injection layer 4 on the base substrate 1 with the above patterns formed and then forming the hole transport layer 5 on the hole injection layer 4. Both the hole injection layer 4 and the hole transport layer 5 may be prepared by a vacuum evaporation process. During the evaporation, an open mask may be used for evaporating an organic material forming the hole injection layer 4 or the hole transport layer 5 in a display region of the display panel. The hole injection layer 4 and the hole transport layer 5 both cover the entire display region of the display panel and each film layer has an integrated structure. The hole injection layer 4 and the hole transport layer 5 are common film layers of the first sub-pixel P1, the second sub-pixel P2 and the third sub-pixel P3. In other examples, both the hole injection layer 4 and the hole transport layer 5 may be prepared by a solution method such as a spin coating method, spray coating method, screen printing method, or inkjet printing method and the like.

(5) forming an electron block layer 6, a second light-emitting layer 7, a buffer layer 8, and a first light-emitting layer 9.

Figure 7:
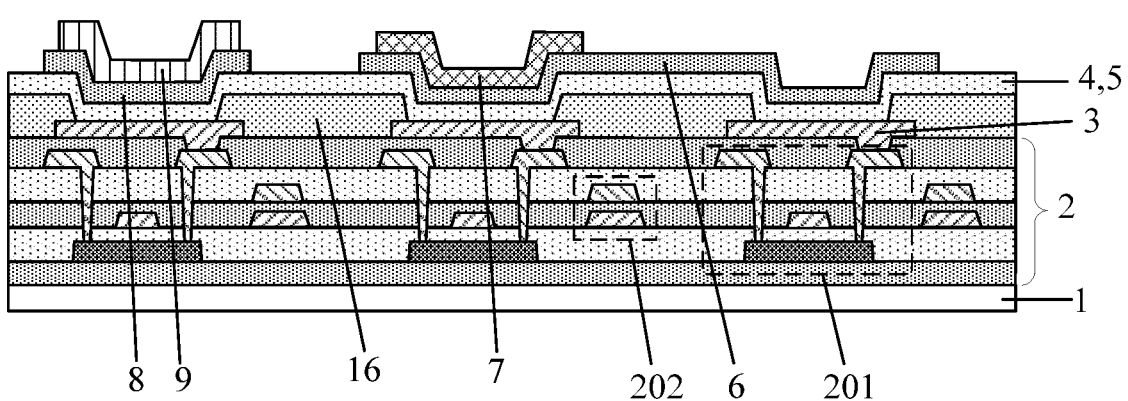
FIG. 7 is a schematic diagram of a structure after an electron block layer, a second light-emitting layer, a buffer layer and a first light-emitting layer are formed on the hole transport layer of FIG. 6 according to some exemplary embodiments.

In the process of preparing the display panel shown in FIG. 3, the preparation process of this step may be:

As shown in FIG. 7, the electron block layer 6 may be formed on the hole transport layer 5 in the second sub-pixel P2 and the third sub-pixel P3 using a vacuum evaporation process, wherein an orthographic projection of the electron block layer 6 on the base substrate 1 contains an orthographic projection of the third opening and the second opening on the base substrate 1 and does not overlap with an orthographic projection of the first opening on the base substrate 1.

As shown in FIG. 7, the second light-emitting layer 7 may be formed on the electron block layer 6 in the second sub-pixel P2 using a vacuum evaporation process, wherein an orthographic projection of the second light-emitting layer 7 on the base substrate 1 contains an orthographic projection of the second opening on the base substrate 1 and does not overlap with an orthographic projection of the first opening and the third opening on the base substrate 1.

As shown in FIG. 7, the buffer layer 8 may be formed on the hole transport layer 5 in the first sub-pixel P1 using a vacuum evaporation process, wherein an orthographic projection of the buffer layer 8 on the base substrate 1 contains the orthographic projection of the first opening on the base substrate 1 and dose not overlap with an orthographic projection of the second opening and the third opening on the base substrate 1.

As shown in FIG. 7, the first light-emitting layer 9 may be formed on the buffer layer 8 in the first sub-pixel P1 using a vacuum evaporation process, wherein an orthographic projection of the first light-emitting layer 9 on the base substrate 1 contains the orthographic projection of the first opening on the base substrate 1 and does not overlap with the orthographic projection of the second opening and the third opening on the base substrate 1.

In FIG. 7, a corresponding FMM may be used in the process of forming the electron block layer 6, the second light-emitting layer 7, the buffer layer 8 or the first light-emitting layer 9 by the vacuum evaporation process.

Figure 8:
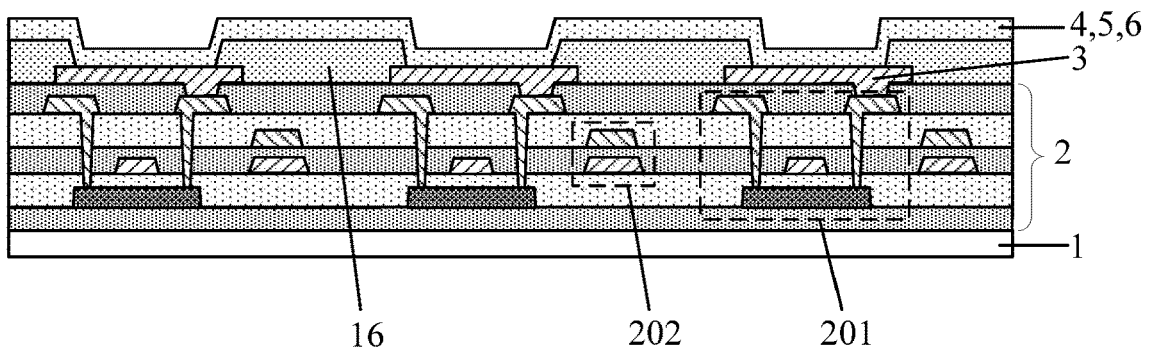
FIG. 8 is a schematic diagram of a structure after a driving structure layer, a first electrode layer, a hole injection layer, a hole transport layer, and an electron block layer are formed on a base substrate during preparation of the OLED display panel shown in FIG. 5 according to some exemplary embodiments.

In the process of preparing the display panel shown in FIG. 5, the preparation process of this step may be:

As shown in FIG. 8, an electron block layer 6 covering the entire display region may be formed on the hole transport layer 5 using an open mask by a vacuum evaporation process, and the orthographic projection of the electron block layer 6 on the base substrate 1 contains an orthographic projection of the third opening, the second opening, and the first opening on the base substrate 1. The electron block layer 6 is a common film layer of the first sub-pixel P1, the second sub-pixel P2, and the third sub-pixel P3. In other examples, the electron block layer 6 may be prepared by a solution method such as a spin coating method, a spray coating method, a screen printing method, or an inkjet printing method, or the like.

Figure 9:
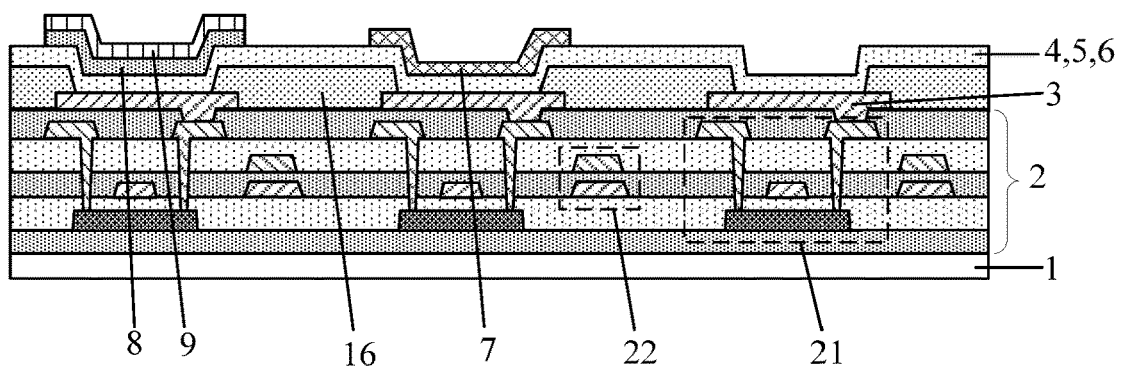
FIG. 9 is a schematic diagram of a structure after a second light-emitting layer, a buffer layer and a first light-emitting layer are formed on the electron block layer of FIG. 8 according to some exemplary embodiments.

As shown in FIG. 9, the second light-emitting layer 7 may be formed on the electron block layer 6 in the second sub-pixel P2 using a vacuum evaporation process, and the orthographic projection of the second light-emitting layer 7 on the base substrate 1 contains the orthographic projection of the second opening on the base substrate 1 and does not overlap with the orthographic projection of the first opening and the third opening on the base substrate 1.

As shown in FIG. 9, the buffer layer 8 may be formed on the electron block layer 6 in the first sub-pixel P1 using a vacuum evaporation process and then the first light-emitting layer 9 may be formed on the buffer layer 8. The orthographic projection of the buffer layer 8 on the base substrate 1 contains the orthographic projection of the first opening on the base substrate 1 and does not overlap with the orthographic projection of the second opening and the third opening on the base substrate 1. The orthographic projection of the first light-emitting layer 9 on the base substrate 1 contains the orthographic projection of the first opening on the base substrate 1 and does not overlap with the orthographic projection of the second opening and the third opening on the base substrate 1.

In FIG. 9, a corresponding fine metal mask (FMM) may be used in the process of forming the second light-emitting layer 7, the buffer layer 8 or the first light-emitting layer 9 by the vacuum evaporation process.

(6) forming a third light-emitting layer 10, a hole block layer 11, an electron transport layer 12, and an electron injection layer 13.

As shown in FIG. 3 and FIG. 5, on the base substrate 1 with the first light-emitting layer 9 and the second light-emitting layer 7 formed, the third light-emitting layer 10, the hole-block layer 11, the electron transport layer 12 and the electron injection layer 13 are sequentially formed utilizing an open mask using a vacuum evaporation process. The third light-emitting layer 10, the hole block layer 11, the electron transport layer 12 and the electron injection layer 13 are all film layers covering the entire display region and having an integrated structure. The third light-emitting layer 10, the hole block layer 11, the electron transport layer 12, and the electron injection layer 13 are common film layers of the first sub-pixel P1, the second sub-pixel P2, and the third sub-pixel P3. In other examples, the third light-emitting layer 10, the hole block layer 11, the electron transport layer 12, and the electron injection layer 13 may all be prepared by a solution method, such as a spin coating method, a spray coating method, a screen printing method, an inkjet printing method, or the like.

(7) forming a second electrode layer 14 on the electron injection layer 13. As shown in FIG. 3 and FIG. 5, a second electrode layer 14 covering the entire display region of the display panel and having an integrated structure may be formed on the electron injection layer 13 using an open mask by a vacuum evaporation process. The second electrode layer 14 may be a cathode.

(8) forming an encapsulation structure layer 15 on the second electrode layer 14. As shown in FIG. 3 and FIG. 5, a first inorganic encapsulation layer, an organic encapsulation layer and a second inorganic encapsulation layer may be sequentially formed on the second electrode layer 14. The first inorganic encapsulation layer, the organic encapsulation layer, and the second inorganic encapsulation layer constitute the encapsulation structure layer 15. In some examples, a light extraction layer may be formed on the second electrode layer 14 prior to the formation of the encapsulation structure layer 15, and the light extraction layer may be prepared using an evaporation process or a solution method.

Figure 10:
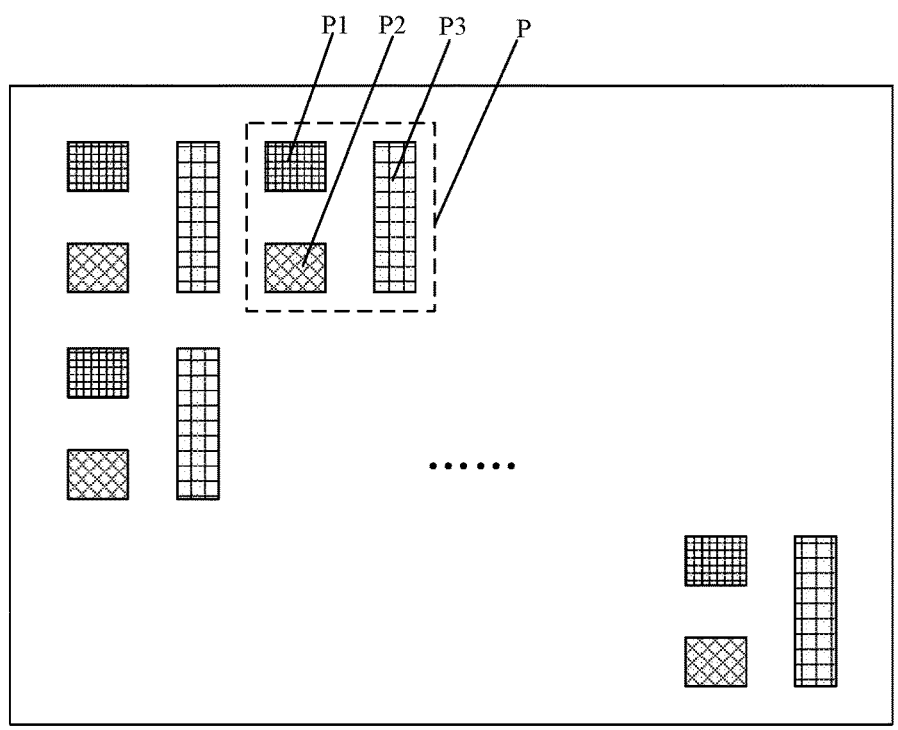
FIG. 10 is a schematic diagram of an arrangement structure of sub-pixels in a display region of an OLED display panel according to an embodiment of the present disclosure.

In some exemplary embodiments, as shown in FIG. 10, multiple pixel units P are arranged in array in a display region of the OLED display panel, wherein each pixel unit P includes three sub-pixels arranged in a form of triangle, which are a first sub-pixel P1 (which may be a red sub-pixel), a second sub-pixel P2 (which may be a green sub-pixel) and a third sub-pixel P3 (which may be a blue sub-pixel) displaying different colors respectively. A pixel unit P is the smallest display unit capable of displaying a different color, which is also called a pixel point for displaying images. FIG. 10 shows only one arrangement of the sub-pixels of the display panel, but in the embodiment of the present disclosure, the arrangement of the sub-pixels and the number of sub-pixels in the pixel unit P are not limited.

In some exemplary embodiments, in the preparation process of the OLED display panel shown in FIG. 2 and FIG. 3, FMMs are required in the preparation process of the electron block layer 6, the second light-emitting layer 7, the buffer layer 8 and the first light-emitting layer 9 using an evaporation process. The FMM is not required for the preparation of other film layers.

Compared with the OLED display panel in FIG. 1, two FMM can be saved in the preparation process of the display panel, which simplifies the manufacturing processes, reduces the manufacturing costs of the display panel and improves the product yield.

In some exemplary embodiments, in the preparation process of the OLED display panel shown in FIG. 4 and FIG. 5, FMMs are required in the preparation process of the second light-emitting layer 7, the buffer layer 8 and the first light-emitting layer 9 using an evaporation process, while FMM is not required for the preparation of other film layers. Compared with the OLED display panel in FIG. 1, three FMMs can be saved in the preparation process of the display panel, which simplifies the manufacturing processes, reduces the manufacturing costs of the display panel and improves the product yield.

Based on the above contents, an embodiment of the present disclosure further provides a method for preparing an OLED display panel, wherein the display panel includes a display region, and the display region includes a first sub-pixel, a second sub-pixel and a third sub-pixel displaying different colors respectively, the preparation method includes steps of: forming a driving structure layer on a base substrate, wherein the driving structure layer comprises a pixel drive circuit;

forming a first electrode layer on a side of the driving structure layer facing away from the base substrate, wherein the first electrode layer includes multiple first electrodes connected with the pixel drive circuit;

forming a pixel definition layer on a side of the first electrode layer facing away from the base substrate, wherein the pixel definition layer is provided with a first opening, a second opening and a third opening for defining the first sub-pixel, the second sub-pixel and the third sub-pixel respectively, and each opening exposes a surface of a first electrode of a sub-pixel defined by the opening facing away from the base substrate;

forming an organic function layer on the side of the first electrode layer facing away from the base substrate, and forming a second electrode layer on the organic function layer, wherein forming the organic function layer on the side of the first electrode layer facing away from the base substrate includes:

forming a first light-emitting layer in the first sub-pixel, and forming a second light-emitting layer in the second sub-pixel, wherein an orthographic projection of the first light-emitting layer on the base substrate contains an orthographic projection of the first opening on the base substrate and does not overlap with an orthographic projection of the second opening and the third opening on the base substrate, an orthographic projection of the second light-emitting layer on the base substrate contains an orthographic projection of the second opening on the base substrate and does not overlap with an orthographic projection of the first opening and the third opening on the substrate; and forming a third light-emitting layer on surfaces of the first light-emitting layer and the second light-emitting layer facing away from the base substrate, wherein the third light-emitting layer covers the display region and has an integrated structure.

In some exemplary embodiments, the first light-emitting layer, the second light-emitting layer, and the third light-emitting layer are configured to emit red light, green light, and blue light, respectively.

In some exemplary embodiments, forming the organic function layer on the side of the first electrode layer facing away from the base substrate further includes: forming an electron block layer in the third sub-pixel and the second sub-pixel before forming the second light-emitting layer in the second sub-pixel, wherein an orthographic projection of the electron block layer on the base substrate contains an orthographic projection of the third opening and the second opening on the base substrate and does not overlap with the orthographic projection of the first opening on the base substrate.

In some exemplary embodiments, forming the organic function layer on the side of the first electrode layer facing away from the base substrate further includes: forming an electron block layer covering the display region and having an integrated structure before forming the first light-emitting layer in the first sub-pixel and forming the second light-emitting layer in the second sub-pixel.

In some exemplary embodiments, forming the organic function layer on the side of the first electrode layer facing away from the base substrate further includes: forming a buffer layer in the first sub-pixel before forming the first light-emitting layer in the first sub-pixel, wherein an orthographic projection of the buffer layer on the base substrate contains an orthographic projection of the first opening on the base substrate and does not overlap with orthographic projections of the second opening and the third opening on the base substrate.

In some exemplary embodiments, forming the organic function layer on the side of the first electrode layer facing away from the base substrate further includes: before forming the electron block layer, forming any one or more of the following film layers on the first electrode layer: a hole injection layer and a hole transport layer, wherein the hole injection layer and the hole transport layer are both film layers covering the display region and having an integrated structure.

An embodiment of the present disclosure further provides a display apparatus which includes the OLED display panel described in any one of the foregoing embodiments. The display apparatus may be: any product or component with a display function, such as a mobile phone, a tablet computer, a television, a laptop computer, a digital photo frame, a navigator and the like.

In the description herein, it is specified that orientation or positional relations indicated by terms "up", "down", "left", "right", "top", "inside", "outside", "axial direction", "four corners" and the like are based on the orientation or positional relations shown in the drawings, and are for ease of description and simplifying the description of the present disclosure and are not intended to indicate or imply that the structures referred to must have a specific orientation, or be constructed and operated in a particular orientation, and therefore they should not be construed as limitations on the technical solutions of the embodiments of the present disclosure.

In the description herein, the terms "connection", "fixed connection", "installation" and "assembly" are to be understood in a broad sense, for example, a connection may be a fixed connection, or a detachable connection, or may be an integral connection, unless explicitly specified and defined otherwise. The terms "installation", "connection" and "fixed connection" may refer to a direct connection, or may an indirect connection through an intermediate medium, or may be an internal connection between two elements. Those of ordinary skills in the art may understand the meanings of the above terms in the present disclosure.

The invention claimed is:

1. An OLED display panel, comprising a display region, wherein the display region comprises a first sub-pixel, a second sub-pixel, and a third sub-pixel displaying different colors respectively;
    the display region comprises a driving structure layer, a first electrode layer, a pixel definition layer, an organic function layer and a second electrode layer sequentially stacked on a base substrate, wherein the first electrode layer includes multiple first electrodes, and the first electrodes are connected with a pixel drive circuit in the driving structure layer, the pixel definition layer is provided with a first opening, a second opening and a third opening for defining the first sub-pixel, the second sub-pixel and the third sub-pixel respectively, wherein each of the openings exposes a surface of a first electrode of a sub-pixel defined by the opening facing away from the base substrate;
    the organic function layer comprises a first light-emitting layer located in the first sub-pixel, a second light-emitting layer located in the second sub-pixel, and a third light-emitting layer covering the display region and having an integrated structure;
    an orthographic projection of the first light-emitting layer on the base substrate contains an orthographic projection of the first opening on the base substrate and does not overlap with an orthographic projection of the second opening and the third opening on the base substrate; an orthographic projection of the second light-emitting layer on the base substrate contains an orthographic projection of the second opening on the base substrate and does not overlap with an orthographic projection of the first opening and the third opening on the base substrate; and
    the third light-emitting layer is disposed on surfaces of the first light-emitting layer and the second light-emitting layer facing away from the base substrate,
    wherein a buffer layer is disposed only in the first sub-pixel, a material of the buffer layer is a material whose hole mobility is higher than electron mobility, and a microcavity length of a microcavity structure of the first sub-pixel is adjusted by adjusting a thickness of the buffer layer and a thickness of the first light-emitting layer, thus obtaining optical and electrical characteristics required by the first sub-pixel.

2. The OLED display panel according to claim 1, wherein the first light-emitting layer, the second light-emitting layer, and the third light-emitting layer are configured to emit red light, green light, and blue light respectively.

3. The OLED display panel according to claim 2, wherein the organic function layer further comprises an electron block layer at least located in the third sub-pixel and the second sub-pixel, an orthographic projection of the electron block layer on the base substrate contains an orthographic projection of the third opening and the second opening on the base substrate, and the second light-emitting layer and the third light-emitting layer in the third sub-pixel are both disposed on a surface of the electron block layer facing away from the base substrate.

4. The OLED display panel according to claim 3, wherein an orthographic projection of the buffer layer on the base substrate contains the orthographic projection of the first opening on the base substrate and does not overlap with the orthographic projection of the second opening and the third opening on the base substrate, and the first light-emitting layer is disposed on a surface of the buffer layer facing away from the base substrate.

5. The OLED display panel according to claim 4, wherein the orthographic projection of the electron block layer on the base substrate does not overlap with the orthographic projection of the first opening on the base substrate.

6. The OLED display panel according to claim 5, wherein the organic function layer further comprises any one or more of following film layers disposed on a side of the electron block layer and the buffer layer facing the first electrode layer: a hole injection layer and a hole transport layer, wherein the hole injection layer and the hole transport layer are both film layers covering the display region and having an integrated structure.

7. The OLED display panel according to claim 6, wherein the film layers disposed on the side of the electron block layer and the buffer layer facing the first electrode layer comprise: the hole injection layer and the hole transport layer sequentially stacked on the first electrodes, wherein the electron block layer and the buffer layer are both disposed on a surface of the hole transport layer facing away from the base substrate.

8. The OLED display panel according to claim 4, wherein the electron block layer covers the display region and has an integrated structure, the orthographic projection of the electron block layer on the base substrate further contains the orthographic projection of the first opening on the base substrate, and the buffer layer is disposed on the surface of the electron block layer facing away from the base substrate.

9. The OLED display panel according to claim 8, wherein the organic function layer further comprises any one or more of the following film layers disposed between the first electrode layer and the electron block layer: a hole injection layer and a hole transport layer, wherein the hole injection layer and the hole transport layer are both film layers covering the display region and having an integrated structure.

10. The OLED display panel according to claim 9, wherein the film layers disposed between the first electrode layer and the electron block layer comprise the hole injection layer and the hole transport layer sequentially stacked on the first electrodes, wherein the electron block layer is disposed on a surface of the hole transport layer facing away from the base substrate.

11. The OLED display panel according to claim 1, wherein the organic function layer further comprises any one or more of the following film layers disposed between the third light-emitting layer and the second electrode layer: a hole block layer, an electron transport layer and an electron injection layer, wherein the hole block layer, the electron transport layer and the electron injection layer are all film layers covering the display region and having an integrated structure.

12. The OLED display panel according to claim 11, wherein the film layers disposed between the third light-emitting layer and the second electrode layer comprise: the hole block layer, the electron transport layer, and the electron injection layer sequentially stacked, wherein the hole block layer is disposed on a surface of the third light-emitting layer facing away from the base substrate, and the second electrode layer is disposed on a surface of the electron injection layer facing away from the first electrode layer.

13. The OLED display panel according to claim 1, wherein each film layer of the organic function layer in the third sub-pixel covers the display region and has an integrated structure.

14. A display apparatus, comprising the display panel according to claim 1.

15. A method for preparing an OLED display panel comprising a display region, the display region comprising a first sub-pixel, a second sub-pixel, and a third sub-pixel displaying different colors respectively, the method comprises:
forming a driving structure layer on a base substrate, wherein the driving structure layer comprises a pixel drive circuit;
forming a first electrode layer on a side of the driving structure layer facing away from the base substrate, wherein the first electrode layer comprises multiple first electrodes connected with the pixel drive circuit;
forming a pixel definition layer on a side of the first electrode layer facing away from the base substrate, wherein the pixel definition layer is provided with a first opening, a second opening and a third opening for defining the first sub-pixel, the second sub-pixel and the third sub-pixel respectively, and each of the openings exposes a surface of a first electrode of a sub-pixel defined by the opening facing away from the base substrate;
forming an organic function layer on the side of the first electrode layer facing away from the base substrate, and forming a second electrode layer on the organic function layer, wherein forming the organic function layer on the side of the first electrode layer facing away from the base substrate includes:
forming a first light-emitting layer in the first sub-pixel, and forming a second light-emitting layer in the second sub-pixel, wherein an orthographic projection of the first light-emitting layer on the base substrate contains an orthographic projection of the first opening on the base substrate and does not overlap with an orthographic projection of the second opening and the third opening on the base substrate, an orthographic projection of the second light-emitting layer on the base substrate contains an orthographic projection of the second opening on the base substrate and does not overlap with an orthographic projection of the first opening and the third opening on the base substrate; and
forming a third light-emitting layer on surfaces of the first light-emitting layer and the second light-emitting layer facing away from the base substrate, wherein the third light-emitting layer covers the display region and has an integrated structure,
wherein a buffer layer is disposed only in the first sub-pixel, a material of the buffer layer is a material whose hole mobility is higher than an electron mobility, and a microcavity length of a microcavity structure of the first sub-pixel is adjusted by adjusting a thickness of the buffer layer and a thickness of the first light-emitting layer, thus obtaining optical and electrical characteristics required by the first sub-pixel.

16. The method for preparing an OLED display panel according to claim 15, wherein the first light-emitting layer, the second light-emitting layer, and the third light-emitting layer are configured to emit red light, green light, and blue light respectively.

17. The method for preparing an OLED display panel according to claim 16, wherein forming the organic function layer on the side of the first electrode layer facing away from the base substrate further comprises: forming an electron block layer in the third sub-pixel and the second sub-pixel before the second light-emitting layer is formed in the second sub-pixel, wherein an orthographic projection of the electron block layer on the base substrate contains an orthographic projection of the third opening and the second opening on the base substrate and does not overlap with the orthographic projection of the first opening on the base substrate.

18. The method for preparing an OLED display panel according to claim 17, wherein forming the organic function layer on the side of the first electrode layer facing away from the base substrate further comprises: forming the buffer layer in the first sub-pixel before the first light-emitting layer is formed in the first sub-pixel, wherein an orthographic projection of the buffer layer on the base substrate contains the orthographic projection of the first opening on the base substrate and does not overlap with the orthographic projection of the second opening and the third opening on the base substrate.

19. The method for preparing an OLED display panel according to claim 17, wherein forming the organic function layer on the side of the first electrode layer facing away from the base substrate further comprises: before forming the electron block layer, forming any one or more of the following film layers on the first electrode layer: a hole injection layer and a hole transport layer, wherein the hole injection layer and the hole transport layer are both film layers covering the display region and having an integrated structure.

20. The method for preparing an OLED display panel according to claim 16, wherein forming the organic function layer on the side of the first electrode layer facing away from the base substrate further comprises: forming an electron block layer covering the display region and having an integrated structure before the first light-emitting layer is formed in the first sub-pixel and the second light-emitting layer is formed in the second sub-pixel.

\* \* \* \* \*